United States Patent [19]

Clark

[11] Patent Number: 4,604,613

[45] Date of Patent: Aug. 5, 1986

[54] STATUS-INDICATING CURRENT INTERRUPTER

[75] Inventor: Thomas F. Clark, Canton, Mass.

[73] Assignee: Phoenix Electric Corporation, Boston, Mass.

[21] Appl. No.: 621,540

[22] Filed: Jun. 18, 1984

[51] Int. Cl.[4] .............................................. G08B 21/00
[52] U.S. Cl. .................................... 340/638; 340/644; 250/227
[58] Field of Search ....................... 340/644, 619, 638; 250/227

[56] References Cited

U.S. PATENT DOCUMENTS

| 4,281,322 | 7/1981 | Nasu et al. | 340/638 |
| 4,367,460 | 1/1983 | Hodara | 340/555 |
| 4,429,231 | 1/1984 | De Loach et al. | 250/227 X |

*Primary Examiner*—James L. Rowland
*Assistant Examiner*—Jeffery A. Hofsass
*Attorney, Agent, or Firm*—Cesari and McKenna

[57] ABSTRACT

A high voltage current interrupter has integral therewith a fiber optic cable extending into the housing for carrying a failure-indication signal back to a remote monitor station when current flow through the interrupter is interrupted. In the preferred embodiment described herein, the optical cable extends continuously between optical input and output ports of the current interrupter and carries a monitor signal which is continuously present during normal operation. When a fault current occurs, the cable is explosively severed to interrupt the monitor signal and thereby provide a fault indication signal to the monitoring station.

11 Claims, 2 Drawing Figures

STATUS-INDICATING CURRENT INTERRUPTER

BACKGROUND OF THE INVENTION

A. Field of the Invention

The invention relates to current interrupters, and comprises a current interrupter providing an indication at a remote monitoring station of an interruption of current flow through the interrupter.

B. Prior Art

Current interrupters are commonly used in electric power systems to interrupt current flow through power lines on the occurrence of fault conditions. In large power systems, the interrupters may carry currents of hundreds or even thousands of amperes, at potentials of thousands of volts.

A variety of current interrupters are currently in use. Thermal current interrupters are commonly used at low current and voltage levels and where only a moderate response time is required. Mechanical interrupters are frequently used where high voltages and currents are carried, and where fast response time is required. Mechanical interrupters physically separate portions of the current path by means such as movement of a piston in response to gas pressure or to other force-applying means such as electromagnets and the like. Recently, explosively-actuated current interrupters have found increasing use in high voltage, high current fast response time applications. These interrupters physically sever the current path by explosive charges.

Current interrupters frequently operate in a hostile environment. In many applications, they are located out of doors and often are not sheltered from the environment. Thus, they are subject to extremes of temperature, moisture, and other such environmental conditions which create a hostile environment for electronic circuitry. Further, they are subject to electromagnetic radiation fields of high intensity, and thus operate in an inherently "noisy" electric environment.

Numerous different types of condition sensors have been used to monitor the status of current flow through interrupters and to provide an indication of the status of current flow to a remote monitor station. Such systems typically have relied on a variety of sensors which monitor such physical parameters as electrical continuity, temperature, pressure, etc., within the interrupter. Signals indicative of these quantities have then been transmitted back to the remote monitor station, typically over standard electric cabling. Because of the hostile environment in which they must operate, significant precautions must be taken to design and construct the sensor so as to insure reliable operation over the range of operating conditions to which it will be subjected. This is particularly true with respect to such parameters as temperature, which seriously degrade operation of electronic circuitry, as well as with respect to noise pick-up in the high-field environment in which the sensor must be located. Thus, reliable sensors are significantly expensive, and add substantially to the cost of the current interrupter.

SUMMARY OF THE INVENTION

A. Objects of the Invention

Accordingly, it is an object of the invention to provide a current interrupter having an improved status indicator.

In particular, it is an object of the invention to provide a current interrupter having a reliable but inexpensive status indicator for providing an indication of its status to a remote location.

B. Brief Description of the Invention

In accordance with the present invention, a current interrupter has a current path, e.g., a continuous metallic bar, enclosed in a housing. An optical current path extends into the housing and carries to the exterior of the housing a signal indicating the status of the current path within the housing. This signal is transmitted to a status indicator at a remote location for appropriate action.

In the preferred embodiment of the invention, the optical path comprises a continuous path extending between an optical inlet port and an optical outlet port extending through the housing wall. The optical path carries an optical signal from a remote location, through the current interrupter, and back to the remote location. As long as current flows through the interrupter in normal fashion, the continuity of the optical path through the interrupter is maintained continuous.

Means are provided to interrupt the optical path when current through the interrupter itself is interrupted, e.g., on sensing a fault in the power system. In the physical embodiment described herein, the optical path is interrupted by physically severing it by means of an explosive charge. Preferably, the same charge is used to sever the current path so as to provide the desired current interruption. On detecting loss of the normally continuous monitor signal, the remote monitoring station generates an alarm indicator to signal the current interruption.

The sensor portion of the system thus comprises a simple, passive element (i.e., an optical cable) which is relatively insensitive to the environmental conditions under which it must operate, immune to noise interference otherwise normally caused by the high electromagnetic fields in its vicinity, and quite inexpensive to construct. Further, it requires only relatively simple optical signal generation and detection circuitry at the remote monitor station. Accordingly, it leads to a highly reliable yet comparatively inexpensive fault-indicating current interrupter, and one whose operation is inherently fail-safe.

DETAILED DESCRIPTION OF THE INVENTION

Figure 1:
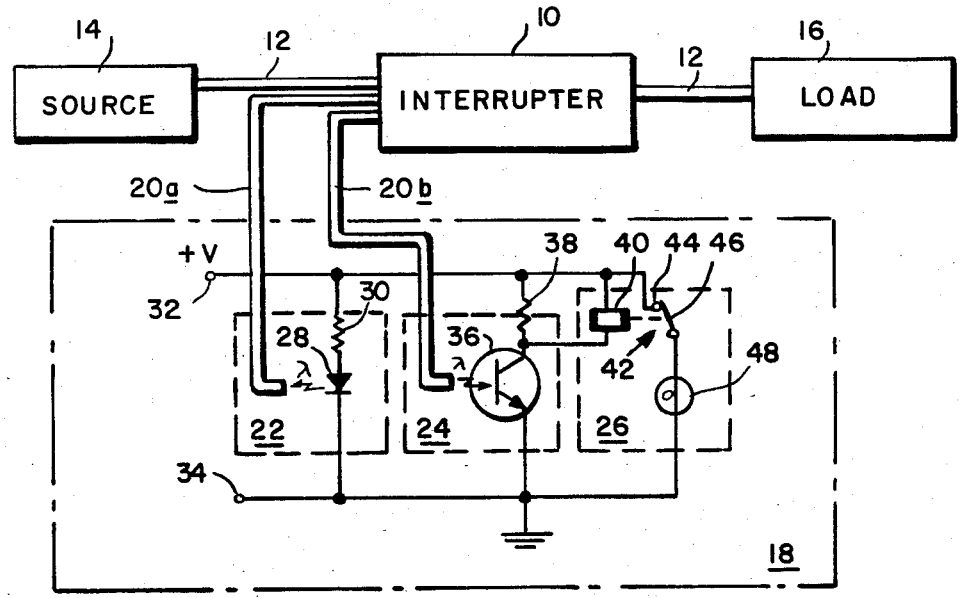
Figure 2:
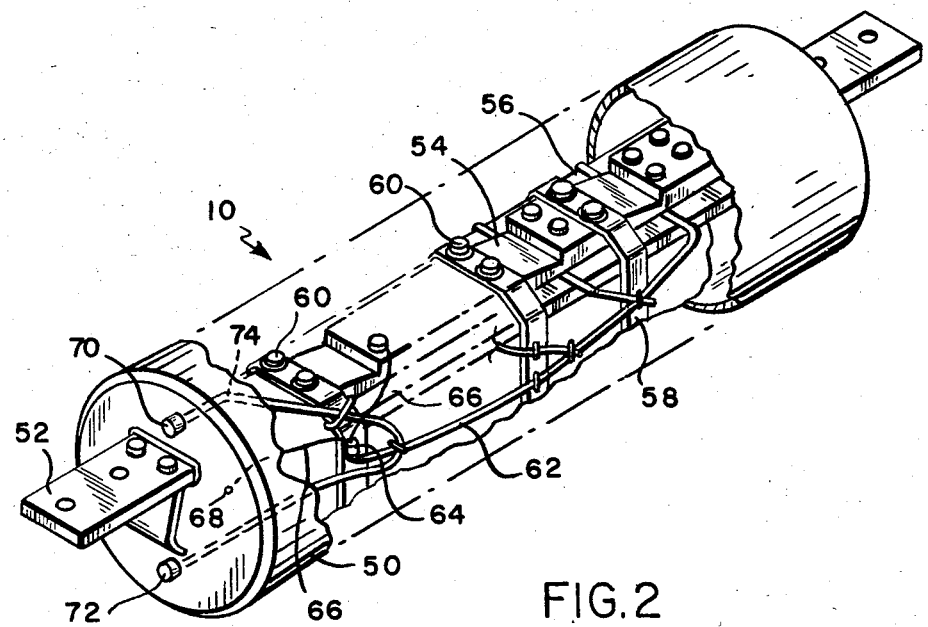

The foregoing and other and further objects and features of the invention will be more readily understood from the following detailed description of the invention, when taken in conjunction with the accompanying drawings, in which:

FIG. 1 is a block and line diagram of a current interrupter in accordance with the present invention; and FIG. 2 is a view in perspective of a current interrupter showing the fault sensor portion of the system in more detail.

In FIG. 1, a current interrupter 10 is positioned in series in a power line 12 which carries power from a power source 14 to a load 16. A remote monitor station 18 is connected to the interrupter 10 by an optical link 20. The link 20 comprises a first fiber optic transmission path 20a and a second fiber optic transmission path 20b. The station 18 includes an optical generator 22 connected to transmit to the interrupter 10 an optical signal over transmission path 20a and an optical detector 24 connected to receive a signal returned from the interrupter 10 via optical path 20b. A signal monitor 26 responds to the detector 24 by providing an output signal indicative of the status of the optical signal returned to detector 24.

In the physical embodiment illustrated herein, optical generator 22 comprises a light emitting diode 28 in series with a resistor 30 connected to a source of positive potential applied between a terminal 32 and a ground terminal 34. Light emitted by the diode is transmitted to the interruptor 10 via fiber optic link 20a. Light is returned from the interrupter 10 via fiber optic link 20b and is coupled to a phototransistor 36 connected in series with a resistor 38 between terminals 32 and 34. A coil 40 of a normally-open relay 42 is connected between terminal 32 and the collector of transistor 36. The relay is shown in the energized or closed position in which current is carried from terminal 32 through a terminal 44 of the relay and thence through an arm 46 of the relay and an indicating lamp 48 to ground. Of course, other status indications or control elements could be used in place of lamp 48.

Turning now to FIG. 2, the current interrupter of FIG. 1 is shown in more detail. The interrupter itself may comprise any of a number of known current interrupters; the interrupter shown here for illustrative purposes only is described in more detail in the corresponding application of Herbert M. Pflanz entitled Passively Detonated Pyro-Assisted Fuse filed Dec. 19, 1983, Ser. No. 06/562,827 now Pat. No. 4,538,133 and assigned to the Phoenix Electric Corp., the assignee of the present invention. For purposes of the present invention, it is sufficient to note that the interrupter illustrated here comprises a housing 50 having a current path 52 in the form of a bus bar extending therethrough. The bus bar 52 has stepped-down portions 54 of diminished thickness for reasons later to be described. The bus bar is secured to a non-conductive base 56 by bolts 60. An explosive cord 62 is positioned at the thin end of the stepped-down portions 54 between the support 56 and the bus bar 52. The cord is connected to an detonator 64 having leads 66 connected between the bus bar on the one hand and an external connector 68 on the other. The detonator is activated from an external sensor in a known manner on detection of a fault current. Connectors 70, 72, extend through the housing 50 and connect to a continuous loop of fiber optic cable 74 in the interior of housing 50. Similarly connectors 70, 72 connect to fiber optic cable 20a, 20b, respectively, on the exterior of the housing. Cable 74 is anchored to straps 58 by means of a tie 76 and is connected to the explosive cord 42 by means of ties 78. The latter ties mechanically secure the cable in direct contact with the cord so the detonation of the explosive cord insures that the cable will be severed.

In normal operation, interrupter 10 carries current through the bus bar 52, and fiber optic link 20 carries an optical signal to the interrupter 10 via cable 20a and thence through cable 74 and cable 20b back to monitor 18. As long as phototransistor 36 receives light from cable 20b, the transistor conducts and its collector is close to ground potential. Accordingly, current flows through coil 40 and maintains the arm of normally-open relay 42 in the closed position as shown. Accordingly, indicator 48 (FIG. 1) remains lit to indicate normal operation of the interrupter. When a fault in the system is detected, however, a firing signal is applied to terminal 68 to activate detonator 64. Activation of detonator 64 detonates (ignites) cord 62 which, in turn, severs cable 74 and also explosively severs the stepped-down portions of bus bar 52 to thereby interrupt current flow through the bus bar. When cable 74 is severed, it ceases to carry a return signal to cable 20b and phototransistor 36 thereby turns "off". Relay 42 then returns to its normally open state and indicator light 48 goes out, thereby indicating interruption of current through the interrupter 10.

Monitor station 18 may, depending on the application, be placed either very close to, or at a substantial distance from, the interrupter 10. In particular, the distance between the monitor station and the interrupter may vary from portions of a foot in some cases to hundreds or more, in other cases. In either instance, the fiber optic link provides a relatively mechanically rugged, electrically noise immune signal path for carrying the status indicator signal between the interrupter and the monitor station.

In the physical embodiment that has been described herein, I have found that a fiber optic cable diameter of approximately 100 microns provides an adequate optical monitoring signal through the cable, yet allows the cable to have sufficient flexibility so as to minimize physical stress, and possible damage, of the cable, during installation. Larger diameter cables may, of course, be used but I have found that the increased stiffness of such cables increases the likelihood of their being damaged during installation unless particular care is paid during installation. Smaller cables may also, of course, be used but, as the diameter drops much below 100 microns, the amount of light transmitted through the cable decreases significantly and a stronger light source, or more sensitive detector, may be required, thereby increasing the cost. Further, the mechanical integrity of the cable may also decrease to an unacceptable extent.

It will be understood by those skilled in the art that various changes may be made in the foregoing without departing from either the spirit or the scope of the invention. For example, the inlet port and outlet port need not be on the same face of the interrupter but may be at opposite ends thereof, the fiber optic cable then passing from one end of the conductor through the other between the two ports. Further, although desirable, it is not necessary to utilize two cables, one for the transmission path and one for the return path. A single cable may be used and light may be returned along this same cable by a reflector internal to the interrupter, the desired fault warning then being generated by movement of this reflector or change in its physical characteristics (e.g., decreasing its reflectivity or, conversely, increasing its reflectivity) so as to generate the desired signal indicating a change of status within the interrupter. With a single cable, of course, it will be necessary to provide a branch at the monitor end of the cable so as to provide separate paths locally to the optical signal generator and the optical signal detector, respectively. Further, where the interrupter is of the explosive type as here, the explosion itself may be used to provide the light signal indicating the occurrence of a fault, and the optical signal generator then may be omitted entirely. Various other modifications may be made with respect to the optical system and it will be understood that the foregoing is to be taken as illustrative only, and not in a limiting sense, the scope of the invention being defined with particularity in the claims.

What is claimed as new and desired to be secured by Letters Patent of the United States is:

1. A high voltage current limiter providing an indication of current flow therethrough, comprisng a housing enclosing an interruptable current path extending therethrough, a continuous path of fiber optic cable extending through said housing between an input port and an output port thereof and providing a continuous optical transmission path between said ports for carrying an optical signal indicative of the status of current flow through said current path, and an explosive charge for severing said cable on interruption of current flow through said current path means for establishing a failure-indicating signal on said light path on interruption of current flow through said current path.

2. A current interrupter according to claim 1 in which said explosive charge is positioned to sever said cable concurrently with the current path.

3. A current interrupter providing an indication at a remote location of the status of current flow therethrough, said interrupter comprising a housing enclosing a current path extending therethrough, a fiber optic cable having a loop extending through said housing between an input port and an output port thereof for carrying a monitoring signal from a remote source, through the housing, and back to the remote source as long as said cable is intact, and an explosive charge for severing said cable concurrently with interruption of current flow through said current path to interrupt said monitor signal and thereby provide an indication of current interruption through said current path.

4. A current interrupter according to claim 3 in which said explosive charge is positioned to sever both said cabel and said current path.

5. A current interrupter providing an indication of the status of current flow therethrough, comprising a housing enclosing a current path extending therethrough, a continuous loop of fiber optic cable extending between an input port and an output port of said housing for carrying a continuous optical signal therethrough for transmission to a remote location and indicative of the status of current flow through said current path, the fiber optic cable being severable on interruption of current flow through said current path, and means for explosively severing said fiber optic cable on interruption of current flow through said current path to thereby provide a failure signal to said remote location.

6. A high voltage current limiter providing an indication of current flow therethrough, comprising a housing enclosing an interruptable path extending therethrough and having an input port and an output port means, including fiber optic cable extending through said housing for defining a light path extending between the input port and the output port for carrying an optical signal indicative of the status of current flow through said current path, and an explosive charge for interrupting said light path on interruption of current flow through said current path to establish a failure-indication signal.

7. A current interrupter according to claim 6 in which said explosive charge is positioned to interrupt said light path concurrently with interruption of current flow through said current path.

8. A current interrupter according to claim 7 in which the explosive charge is positioned to interrupt both said current path and said light path.

9. A current interrupter providing an indication at a remote location of the status of current flow therethrough, said interrupter comprising a housing enclosing a current path extending therethrough and having an input port and an output port, means defining a light path extending through said housing from the input port to the output port, fiber optic cable for carrying a monitoring signal from a remote source, through the input port, and back through the output port to the remote source as long as said light path is not interrupted, and an explosive charge for interrupting said light path to interrupt said monitor signal and thereby providing an indication of current interruption through said current path.

10. A current interrupter according to claim 9 in which said explosive charge is positioned to interrupt said light path concurrently with interruption of current flow through said current path.

11. A current interrupter according to claim 10 in which said explosive chagre is positioned to interrupt both said cable and said current path.

* * * * *